(12) United States Patent
Tisné et al.

(10) Patent No.: US 8,589,134 B2
(45) Date of Patent: Nov. 19, 2013

(54) METHOD AND SYSTEM EMPLOYING FLOW SIMULATION FOR IMPROVING MATERIAL DELIVERY IN LENS MANUFACTURING

(75) Inventors: Séverine Tisné, Shrewsbury, MA (US); Paresh Kitchloo, North Attleboro, MA (US)

(73) Assignee: Gentex Optics, Inc., Carbondale, PA (US)

( * ) Notice: Subject to any disclaimer, the term of this patent is extended or adjusted under 35 U.S.C. 154(b) by 296 days.

(21) Appl. No.: 13/025,246

(22) Filed: Feb. 11, 2011

(65) Prior Publication Data

US 2012/0209580 A1 Aug. 16, 2012

(51) Int. Cl.
*G06G 7/50* (2006.01)
*B28B 13/02* (2006.01)
*B29C 45/18* (2006.01)

(52) U.S. Cl.
USPC ............ 703/9; 703/6; 425/143; 425/144; 425/145

(58) Field of Classification Search
None
See application file for complete search history.

(56) References Cited

U.S. PATENT DOCUMENTS

| | | | |
|---|---|---|---|
| 6,816,820 B1 | 11/2004 | Friedl et al. | |
| 7,277,771 B2 | 10/2007 | Kono et al. | |
| 7,289,874 B2 | 10/2007 | McBain et al. | |
| 7,470,382 B2 * | 12/2008 | Nagaoka et al. | 264/40.1 |
| 7,574,339 B2 | 8/2009 | Lukis et al. | |
| 2005/0082706 A1 | 4/2005 | Nagaoka et al. | |
| 2006/0282186 A1 * | 12/2006 | Hansen et al. | 700/97 |
| 2008/0100619 A1 | 5/2008 | Chien et al. | |
| 2008/0126047 A1 * | 5/2008 | Lukis et al. | 703/9 |
| 2009/0132212 A1 * | 5/2009 | Herbst et al. | 703/2 |
| 2012/0059637 A1 * | 3/2012 | Yu | 703/6 |
| 2012/0203375 A1 * | 8/2012 | Dorin et al. | 700/200 |

FOREIGN PATENT DOCUMENTS

| | | |
|---|---|---|
| EP | 0876900 A1 | 11/1998 |
| EP | 1218163 B1 * | 11/2003 |
| JP | 05189526 | 7/1993 |
| JP | 08230007 | 9/1996 |

OTHER PUBLICATIONS

Zhou, Huamin & Li, Dequn "A Numerical Simulation of the filling stage in Injection Molding Based on a Surface Model" Advances in Polymer Technology, vol. No. 2, pp. 125-131 (2001).*

(Continued)

*Primary Examiner* — Kamini S Shah
*Assistant Examiner* — Jay B Hann
(74) *Attorney, Agent, or Firm* — Keusey & Associates, P.C.

(57) ABSTRACT

A method and system for monitoring lens material residence within a conduit to improve the quality of molded products by reducing defects arising from entrapped lens material. According to the method a finite element mesh representative of a conduit is stored in a digital storage device. A simulation is run on a digital computer in which one type of lens material sequentially flows through the conduit in discrete batches temporal history of the batches within the conduit is tracked. The simulation is useful for analyzing material delivery conduits in injection molding and casting systems, for example, for lens manufacturing. According to the system, a digital storage device stores a finite element mesh representative of a conduit. A digital computer is coupled to the digital storage device for executing a set of instructions to run a simulation and track the temporal history of the batches within the conduit.

20 Claims, 5 Drawing Sheets

(56) References Cited

OTHER PUBLICATIONS

Database WPI, Week 200911, Thomson Scientific, London, GB; AN 2009-E49621 XP0002678210 & JP 2009 023254 A (Toray Eng. Co., Ltd.) Feb. 5, 2009, abstract.

"Metal Joining Technology for 21st Century Hot Runner Systems," Polyshot eNews, Sep. 24, 2007, http://www.polyshot.com/html/newsrom.html.

"Getting Started With REM3D Is Fast and Easy," Transvalor, http://www.transvalor.com/rem3d_gb.php.

Chan, G. "Plate Fusing Technology for Designing and Building Manifolds," MoldMaking Technology Magazine, Apr. 1, 2007, http://www.moldmakingtechnology.com.

Chan, G. "FEA of Hot Runners to Optimize Mold Design," MoldMaking Technology Magazine, Nov. 1, 2006, http://www.moldmakingtechnology.com.

Schwenk, T. "Hot Runners Help the Balancing Process," MoldMaking Technology Magazine, Dec. 1, 2003, http://www.moldmakingtechnology.com.

\* cited by examiner

FIG. 1 *(Prior Art)*

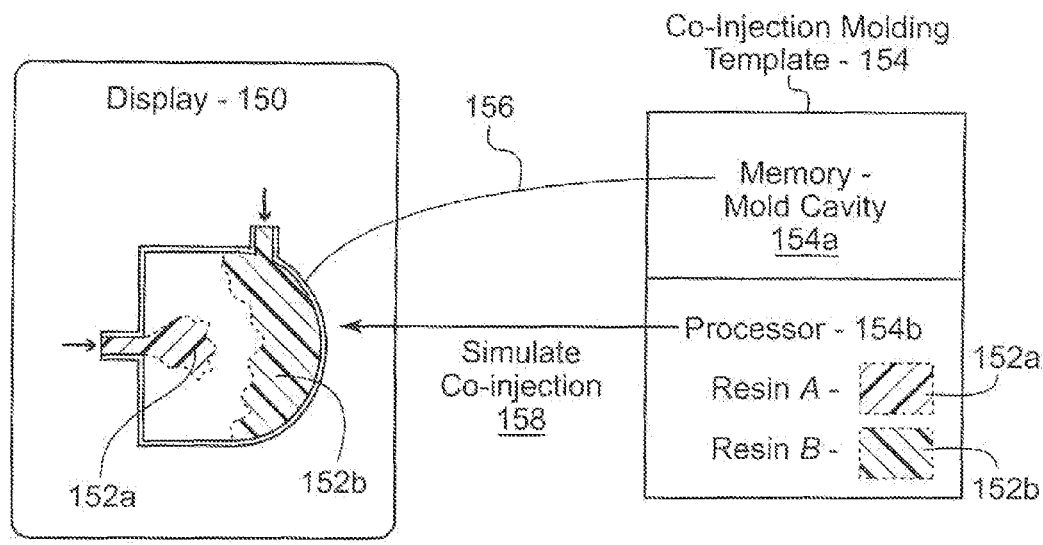
FIG. 3 *(Prior Art)*
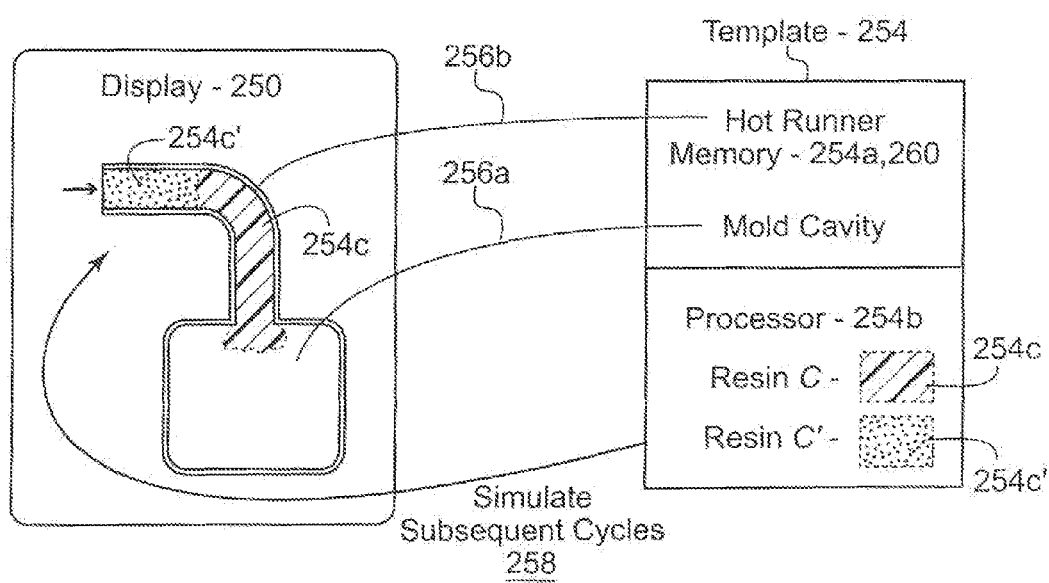
FIG. 4

METHOD AND SYSTEM EMPLOYING FLOW SIMULATION FOR IMPROVING MATERIAL DELIVERY IN LENS MANUFACTURING

BACKGROUND OF THE INVENTION

1. Field of the Invention

The invention relates to methods and systems employing flow simulation for improving material delivery in lens manufacturing.

2. The Prior Art

Software for injection molding simulation typically focuses on mold filling. The REM3D package from Transvalor includes various templates for injection, gas assisted injection, co-injection, thermal coupling with molds and cooling. In the co-injection template, the gate and mold cavity boundaries are defined, and two resins are color coded to simulate their simultaneous injection into the mold cavity. This produces a co-injection molded part with a first resin on the exterior and a second resin filling the central portion of the part. These co-injection molded parts allow resins with different mechanical properties to be combined in a single shot.

U.S. Pat. No. 7,574,339 discloses a method for creating a computerized model of a mold cavity for simulating fluid flow in the cavity. U.S. Pat. No. 6,816,820 and U.S. Patent Application Publication 2005/0082706 describe alternate methods for creating a mold cavity model for determining the number and location of gates. U.S. Pat. No. 7,277,771 discloses a simulation method for combining two materials during injection to create a foamed product. U.S. Pat. No. 7,289,874 describes a method for simulating and optimizing an in mold coating process.

SUMMARY OF THE INVENTION

It is therefore an object of an embodiment of the current invention to identify material degradation defects occurring in the delivery conduits of lens making facilities.

It is a further object to employ flow simulation to analyze various materials under different processing conditions.

It is yet another object to configure a co-injection template to model sequential material flow through a delivery conduit.

It is a further object to create and test various conduit designs in a simulated environment.

It is yet another object to reduce manufacturing defects in lenses by simulating materials and processes.

It is a further object to improve the quality of injection molded lenses by utilizing flow simulation to analyze resin delivery.

It is yet another object to improve the quality of cast lenses by utilizing flow simulation to analyze monomer delivery.

These and other related objects are achieved by a method and system employing flow simulation to improve material delivery in lens manufacturing. According to one embodiment of the invention, a method of monitoring lens material residence within a conduit to improve the quality of molded lenses by reducing defects arising from entrapped lens material is provided. In a first step, a finite element mesh representative of a conduit is stored in a digital storage device. Next a simulation is run on a digital computer in which one type of lens material sequentially flows through the conduit in discrete batches. Next the temporal history of the batches within the conduit is tracked. In the case of injection molding, the thermo-mechanical history of molten resin is tracked within a hot runner. In the case of cast lenses, the temporal history of monomer combined with an initiator is tracked within a delivery conduit.

According to one embodiment, a method is provided for monitoring lens material residence within a conduit to improve the quality of molded lenses by reducing defects arising from entrapped lens material. The method includes storing a finite element mesh representative of a conduit in a digital storage device. Next, a simulation is run on a digital computer in which one type of lens material sequentially flows through the conduit in discrete batches. The temporal history of the batches within the conduit is tracked.

The tracking step includes displaying different batches on a visual display device where each batch is displayed in a visually distinguishable manner, wherein the display device and the storage device are operatively coupled to the digital computer. The running step includes providing a co-injection software template that simulates simultaneously injecting a partial shot of A resin having a first, non-zero, positive flow rate and a partial shot of B resin having a second, non-zero, positive flow rate into a mold cavity during a single molding cycle to form a molded product made collectively from the A and B resins, where the A resin has different physical properties than the B resin and each resin type has a singular display mode. The running step further includes configuring the template to simulate (i) a C material that is the same as a C' material, (ii) the C material batch having a zero flow rate and sitting in the conduit until the C' material batch flows therethrough, and (iii) C material which remains entrapped within the conduit so that product degradation resulting from extended residence time in the conduit can be identified.

The running step also includes running the simulation with new materials by defining the domain of lens manufacturing and generating data from the new material which covers the domain and entering the generated data into the software template. The finite element mesh is stored representative of a cavity in an injection molding machine in the digital storage device, wherein the conduit comprises a hot runner manifold. A simulation is run on a digital computer in which one type of lens material sequentially flows through the hot runner in discrete batches representative of cycles in an injection molding process. The thermo-mechanical history of the batches within the hot runner is tracked.

The material is selected from the group of thermoplastics consisting of polycarbonate, nylon and thermoplastic polyurethane. The simulation accounts for thermal properties of the material and the injection molding machine. The simulation accounts for the flow characteristics of the material as they flow through the hot runner ranging from highly pseudoplastic material flow to highly Newtonian flow, whereby the more pseudoplastic the material flow the less likely it is for the material to form no-flow regions within the hot runner.

A finite element mesh representative of a cold runner and an edge gate in an injection molding machine is stored in the digital storage device, wherein the hot runner manifold connects to the cold runner, and wherein the cold runner connects to each lens forming cavity via only one edge gate. Simulating the flow characteristics identifies where material is entrapped in the hot runner and entrapped material has an extended thermo-mechanical history; the entrapped material subsequently flakes off and enters the lens forming cavity causing defects.

A simulation is run on a digital computer in which one type of castable lens material sequentially flows through the conduit in discrete batches into a casting mold. The temporal history of the batches within the conduit is tracked to identify entrapped material, wherein the entrapped material prematurely polymerizes and subsequently flakes off and enters the casting mold forming defects. The castable lens material is selected from the group of thermoset materials consisting of allyl diglycol carbonate, high index materials having a refractive index above about 1.640, thiourethane and polyurethane.

In an alternate embodiment, there is provided a system for monitoring lens material residence within a conduit to improve the quality of molded lenses by reducing defects arising from entrapped lens material. The system includes a digital storage device storing a finite element mesh representative of a conduit. In addition, a digital computer coupled to said digital storage device for executing a set of instructions to run a simulation in which one type of lens material sequentially flows through the conduit in discrete batches and tracking the temporal history of the batches within the conduit.

The system includes a display device operatively coupled to said digital computer for displaying different batches where each batch is displayed in a visually distinguishable manner. The set of instructions comprise a co-injection software template that simulates simultaneously injecting a partial shot of A resin having a first, non-zero, positive flow rate and a partial shot of B resin having a second, non-zero, positive flow rate into a mold cavity during a single molding cycle to form a molded product made collectively from the A and B resins, where the A resin has different physical properties than the B resin and each resin type has a singular display mode.

The template is configured to simulate (i) a C material that is the same as a C' material, (ii) the C material batch having a zero flow rate and sitting in the conduit until the C' material batch flows therethrough, and (iii) C material which remains entrapped within the conduit so that product degradation resulting from extended residence time in the conduit can be identified. The system includes a new material data record stored in said memory, wherein said new material data record comprises data which covers the domain of lens manufacturing and providing a set of instructions to run the simulation with the new materials.

The system further includes a finite element mesh representative of a cavity in an injection molding machine stored in the digital storage device, wherein the conduit comprises a hot runner manifold. The digital computer executing a set of instructions to simulate one type of lens material sequentially flowing through the hot runner in discrete batches representative of cycles in an injection molding process and tracking the thermo-mechanical history of the batches within the hot runner.

The material is selected from the group of thermoplastics consisting of polycarbonate, nylon and thermoplastic polyurethane. The simulation accounts for thermal properties of the material and the injection molding machine. The simulation accounts for the flow characteristics of the material as they flow through the hot runner ranging from highly pseudoplastic material flow to highly Newtonian flow, whereby the more pseudoplastic the material flow the less likely it is for the material to form no-flow regions within the hot runner.

The memory includes a finite element mesh representative of a cold runner and an edge gate in an injection molding machine in the digital storage device, wherein the hot runner manifold connects to the cold runner, and wherein the cold runner connects to each lens forming cavity via only one edge gate. Executing the set of instructions simulates the flow characteristics and identifies where material is entrapped in the hot runner.

The digital computer contains a set of instructions to simulate one type of castable lens material sequentially flowing through the conduit in discrete batches into a casting mold and tracking the temporal history of the batches within the conduit to identify entrapped material, wherein the entrapped material prematurely polymerizes and subsequently flakes off and enters the casting mold forming defects. The castable lens material is selected from the group of thermoset materials consisting of allyl diglycol carbonate, high index materials having a refractive index above about 1.640, thiourethane and polyurethane.

BRIEF DESCRIPTION OF THE DRAWINGS

The invention will now be described in connection with the appended drawings which form part of this specification. In the drawings, like numbers refer to similar elements throughout the views.

FIG. 3 is a schematic diagram illustrating a prior art single cycle co-injection simulation system.

FIG. 4 is a schematic diagram illustrating an embodiment of the simulation system according to the invention configured for subsequent cycles.

DETAILED DESCRIPTION OF THE PREFERRED EMBODIMENTS

Figure 1:
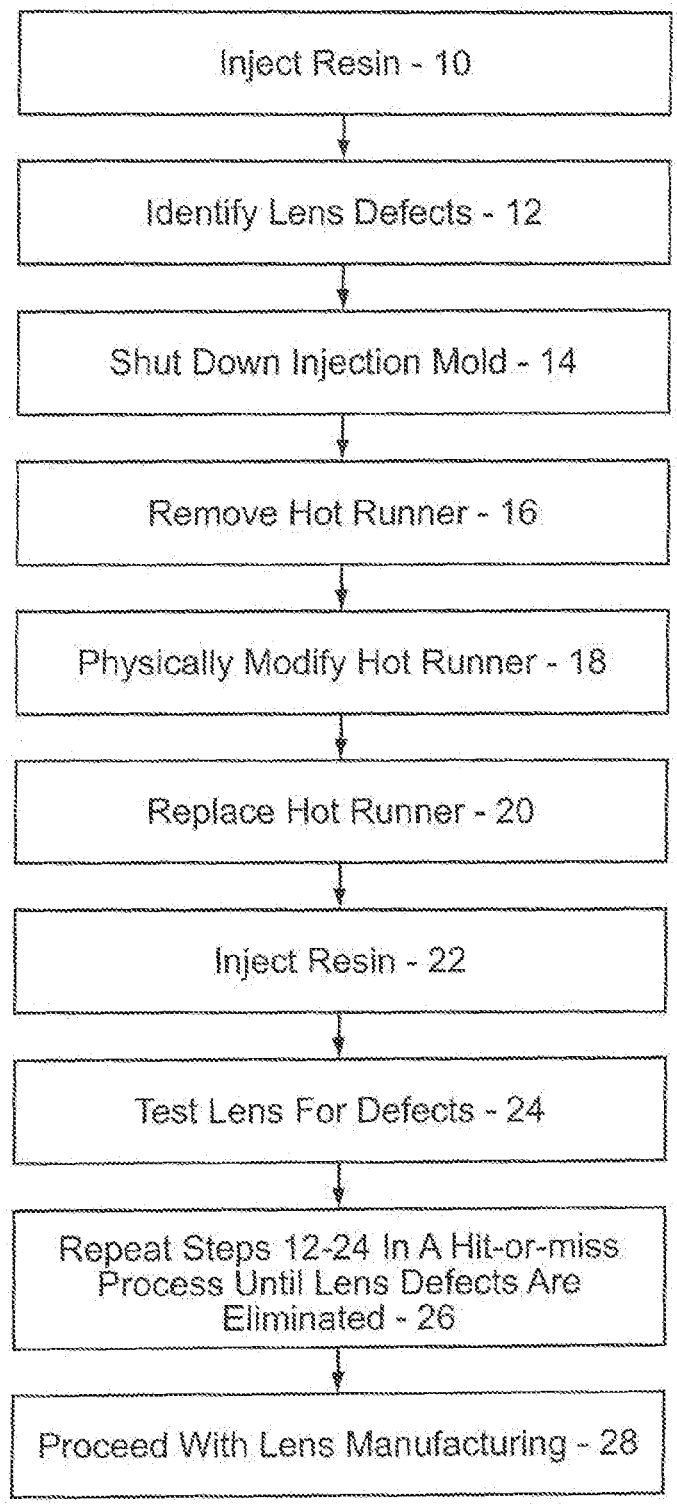
FIG. 1 is a flowchart illustrating a prior art method for correcting defects in a hot runner.

Optical articles, such as lenses may be produced with a variety of materials such as glass or plastic. While glass has been a popular material for ophthalmic lenses, plastic offers certain advantages in that it is lightweight. Plastic lenses can be manufactured from thermoplastics, such as polycarbonate by injection molding, or from thermoset materials by casting.

The plastic material is typically subject to a degree of pre-processing before it is introduced into the lens-forming mold. A delivery conduit may be provided to distribute material from one source to one or more molds in a sequential or batch process. When the molds are filled, it was widely assumed that the old material residing within the conduit would be completely flushed out.

Injection Molding

In injection molding, thermoplastic pellets are delivered to a screw that compresses and melts the pellets within a heated barrel. The thermoplastic may be heated to temperatures between 400 and 500 degrees F. The molten resin is injected by the screw through a nozzle at one end of the barrel into the mold. The mold is held closed across the parting line by a clamp having 100 tons or more of clamping force. The molten resin first enters a hot runner which is temperature controlled to maintain the resin in a molten state. The resin may then enter a cold runner where it is distributed to lens forming cavities. Resin within the cold runner solidifies along with the lens. The mold is opened along its parting line with the cold runner and connected lenses being removed in one piece.

In FIG. 4 the hot runner is shown feeding a mold cavity. The drawing is intended to schematically illustrate the various batches of material that are contained within the hot runner. In actuality, a hot runner may lead to one or more cold runners. The cold runner may terminate in a gate, which is in effect a window that opens into the mold cavity. Typically, a hot runner can lead to a cold runner which then splits to feed 2, 3 or more pairs of lens cavities. Each mold cavity is defined by two mold halves which open and close by operation of the mold clamp. The mold clamp separates the mold halves (not shown for the sake of clarity) to remove the molded part(s) along with their connected cold runners. The invention is concerned with the interaction of subsequent batches of material within the hot runner. In addition, the invention provides improved methods and systems to identify when lens material remains in the hot runner for a second or subsequent cycle. Such a problem does not exist in the cold runner, since all the material in the cold runner solidifies and is removed with the molded part, thereby eliminating any possibility that it would remain in the injection molding machine for a subsequent molding cycle.

In the injection molding process, the lens-forming cavities would be filled by molten resin from the hot runner plus additional material from the screw. While the lenses are solidifying, the molten resin is sitting in the barrel and hot runner being heated and subject to possible degradation. The screw turns and reciprocates within the barrel to compress and inject the resin. This mechanical action insures that old material is forced out of the nozzle by new material entering the barrel at the opposite end. In general, the volume of material held over in the hot runner is small compared to the volume of the mold. Accordingly, during each injection cycle, a substantial quantity of material is transported through the hot runner, for example, 3 to 5 times the hot runner volume. It was assumed that this movement of material through the hot runner would completely flush out the material which remained from the previous cycle.

Referring now in detail to FIG. 1 there is shown a flowchart illustrating one means for addressing hot runner defects according to the prior art. The first two steps summarize a typical injection molding process. Thermoplastic pellets, for example polycarbonate, are introduced into a screw that compresses and transports the pellets along the interior of a heated barrel. As the screw turns, the material is progressively advanced by the helically arranged flights of the screw toward the nozzle. The design of the screw increasingly compresses the material to exclude air or other gases that were entrained in between the pellets. By the time the material reaches the end of the barrel, the thermoplastic is molten and incompressible. As the screw continues to rotate it is forced back away from the nozzle and a charge of molten resin is accumulated just behind the nozzle. In step 10, the screw is advanced forward toward the nozzle, thereby injecting the charge of molten resin into the hot runner.

The hot runner is part of a delivery system that distributes the molten resin to two or more lens forming cavities. The hot runner is a conduit that is formed within part of the mold, known as a hot runner manifold. Temperature control lines circulate heated fluid through the manifold to maintain a high temperature in the hot runner conduit to maintain the resin contained therein in a molten state. Resin may pass from the hot runner to a cold runner, which distributes the resin to lens forming cavities, typically provided in pairs. The screw and hot runner are located on the stationary side of the mold. The cold runner and lens forming cavities are located along the parting line, so that when the movable side of the mold slides away from the parting line, the multiple lenses can be removed from the mold, held together by the cold runner.

The lenses are inspected for a variety of defects ranging from accuracy of optics to coating defects to contamination of the lens material. The cause of some defects has been traced to problems in the hot runner. For example, the hot runner manifold may be heating the resin to an incorrect temperature. Other design or control issues may be adversely effecting the resin during its residence time in the hot runner. The resin is very sensitive to heat, and particularly, high heat over an extended period of time. The injection process ideally melts the resin, holds it in the hot runner for one cycle, then uses it to form lenses on the next cycle. If resin remains in the hot runner, its thermo-mechanical history can exceed the process specifications.

The hot runner may hold a volume of material that is between 10 and 30% of the total cavity volume. Assuming the runner holds 20%, when a new injection molding cycle starts, 80% new material is injected from the screw. This represents four times the volume of material residing within the hot runner. Because of this four-to-one ratio, it was reasonable to expect that all of the old material residing within the hot runner would be cleared out in the next cycle. At worst, it was thought that the old material would be flushed from the hot runner within two cycles, where the new material represents an eight-to-one ratio of new material volume to hot runner volume.

Certain lens defects, for example, brown swirl defects, result from oxidized lens material entering the mold. Molten resin can become oxidized when it is subject to high temperatures for an extended period of time. The total heat delivered to the resin can be measured by tracking the thermal history of the resin. That is, the integrated value of heat delivered over the time as the resin in processed. Engineers theorized that brown swirl defects might be caused by an oxidation process occurring to the resin within the hot runner. In step 12, defects associated with the hot runner are identified.

Previously, to address hot runner defects, the injection mold has to be shut down, per step 14. In order to do this, the machine has to be run for multiple cycles with the feed of pellets halted. The pellets already in the screw need to be processed until the screw, hot runner and mold is cleared of resin. Then the machine has to sit for up to several hours until it is cool enough to be worked on. In step 16, the hot runner manifold is removed from the mold. The hot runner manifold is transported to a machine shop or back to the manufacturer. In step 18, the hot runner is physically modified, usually by adjusting the temperature control channels to deliver more heat to sections of the conduit that is believed to be causing the problem.

In step 20, the hot runner is replaced in the injection molding machine. Power is turned on and the machine is allowed to heat up for several hours before injection molding can resume. Resin is then introduced into the screw and multiple batches of test lenses may be produced and discarded until the process reaches equilibrium. In step 22, resin is injected to make production lenses. In step 24 the productions lenses are tested for defects. If defects still exist that relate to the hot runner, the steps 12-24 may be repeated 26 until the problem is minimized so that production lenses meet specification. Lens manufacturing can continue per step 28.

Figure 2:
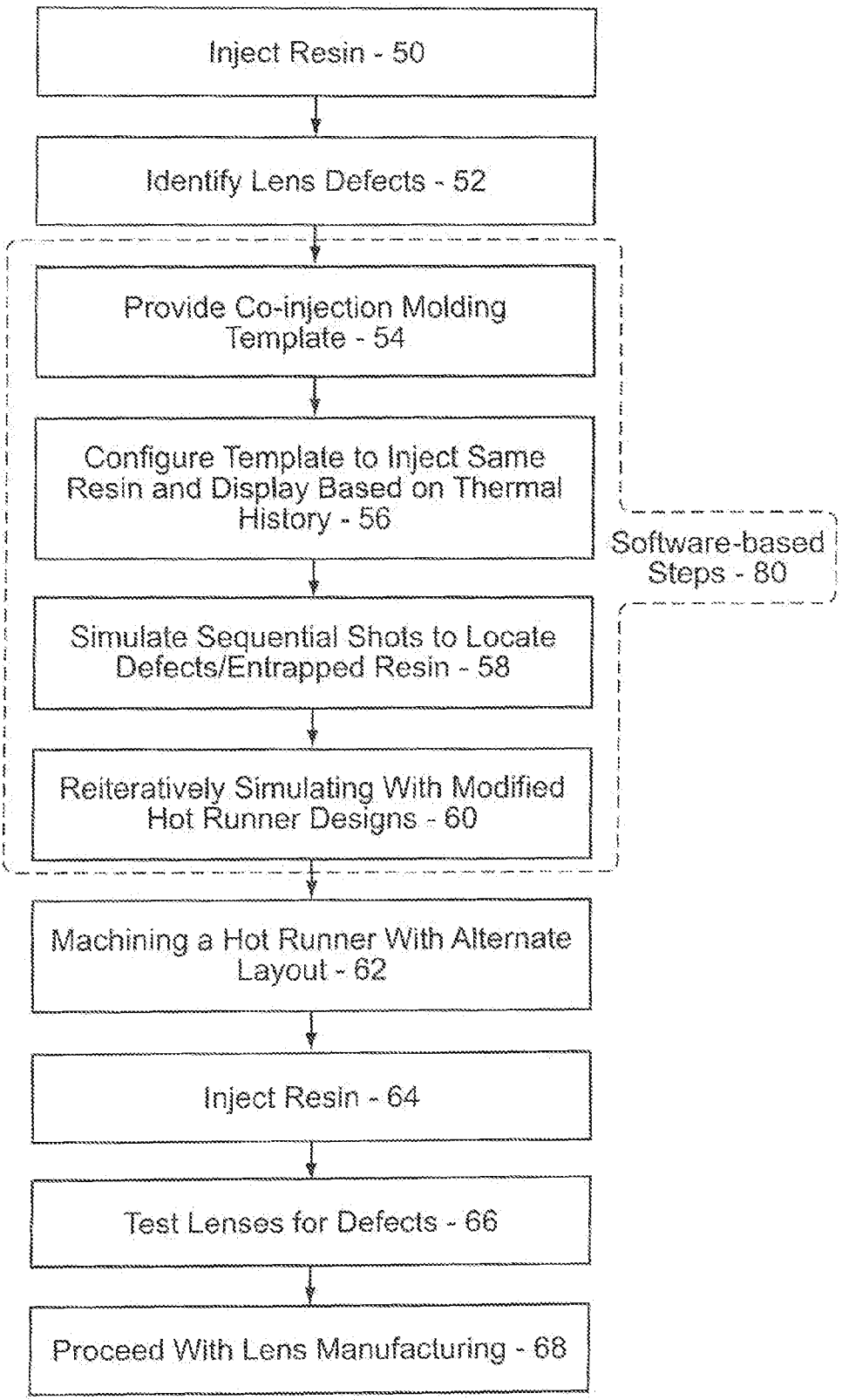
FIG. 2 is a flowchart illustrating one embodiment of a method according to the invention to correct hot runner induced lens defects.

One embodiment according to the invention is described with reference to FIG. 2. Resin is injected in step 50, similar to prior art step 10. Lens defects associated with the hot runner are identified in step 52. The invention then proposes a series of software based steps 80 to address the problem. Surprisingly, the invention uses a co-injection molding template software application 54 to address hot runner defects. The software is a product of Transvalor and is known as their REM3D package.

The REM3D package includes a pre-processor for data preparation and a post-processor which enables easy visualization of the simulation results. The pre-processor is called GIpre and uses specific templates for injection, gas assisted injection, co-injection, thermal coupling with molds and cooling applications. A project manager can handle multiple simulations with different process setting. It includes readers for different file formats such as Step, Patran, Nastran, Ideas Universal and STL formats. A material database includes about several hundred polymer references. Other materials can be specified by the user.

REM3D also includes a module for meshing the initial volume of the part. The automatic mesher is used to create the volume mesh (with 4 node tetrahedrons) of the part to be filled, starting with a surface mesh (with 3 node linear triangles). The first step in a standard computation is to define the gate, all boundary conditions and the material data, via the pre-processor. The second step is to run the simulation with the Computation manager included within the GIpre module. The 3D OpenGL post-processor, GIview enables the user to look at results.

FIG. 3 is an illustration where an A (152a) resin is coded with a cross-hatch pattern different from the cross-hatch pattern of a B (152b) resin. The A and B resins are delivered from two separate delivery systems via two gates into the mold cavity 156 which is stored as a finite element mesh in digital memory 154a. The display 150 and memory 154a are coupled to a general purpose computer processor 154b that is running the co-injection template software.

The co-injection molding template 154 is a simulation application that allows engineers to visual how two resins would fill a mold cavity. Co-injection is a process where two different resins are injected in to one mold to form one part. The two resins typically have different material properties. Thus a part molded from two different resins may have better qualities than a part molded from a single resin. For example, one material with a high gloss finish can be used for the exterior, and a less expensive material can be used as the central filler. A high density material can be used for an exterior surface to provide wear resistance, and a lighter material can be used on the interior to reduce the weight of the part.

Accordingly, to simulate a co-injection process 158, the software processes the flow of two different resins into the mold cavity. Each resin enters the mold cavity through its own gate via a separate delivery system. As can be appreciated by those skilled in the art, the different materials will be introduced in varying amounts and at independently controlled pressure levels.

In contrast, the invention configures the co-injection template to process two categories of the same resin, where each resin will be displayed differently based on its thermo-mechanical history, per step 56. Rather than providing a finite element (FE) mesh of the mold cavity only, according to the invention, an FE mesh representative of a conduit, e.g. hot runner and/or cold runner leading to the mold cavity is provided. The simulation will transport the resins from the same delivery system, through one conduit and a single gate in to the mold cavity. By coding the resins for thermo-mechanical history, one can differentiate the resins from each other, which would not be possible if the materials were coded for mechanical properties, as contemplated by the co-injection software template.

When running a co-injection scenario, the different resins are set to non-zero flow rates as they flow through different gates into the same mold cavity. According to the invention, the first batch of resin C is sitting in the hot runner at a zero flow rate. As this material sits in a molten state, the thermo-mechanical history is increasing. In the invention, sequential shots are simulated in step 58. More particularly, the next batch of resin C' is injected from the screw through the nozzle into the hot runner.

FIG. 4 illustrates how the simulation template 254 is modified to display the hot runner leading through one gate into the mold cavity. The hot runner 256b and mold cavity 256a are stored as a finite element mesh in memory 254a. The display 250 and memory 254a are coupled to a general purpose computer processor 254b that is running the co-injection template software. The C (254c) and C' (254c') resin are chosen to be the same material. The C resin is coded for a first cross-hatch pattern, and the C' resin for a different cross-hatch pattern.

The volume of C material sitting in the hot runner is about $\frac{1}{5}$ of the volume of C' material that will be entering the hot runner in the next batch. As the C' material passes through the hot runner, one would expect that the C material is first pushed out. In other words, the 4 parts of C' material should completely displace the 1 part of C material. In the simulation, the C resin is coded as a red color, and the C' material is coded as a green color. After simulating 258 the C' shot, any red material remaining in the hot runner would indicate that C resin is entrapped thereby suggesting a defect in the design of the hot runner.

One solution is to create an alternate FE mesh of a modified hot runner 260, and run the simulation to see if the C resin is still entrapped, or if a reduced amount is entrapped, per step 60. One experiment indicated that that 2% of the C resin remains entrapped after the C' resin is shot. After the next cycle if 2% of the 2% might still remain in the hot runner, with additional C' resin remaining embedded after the next cycle. The embedded resin may reside in corners against the wall of the hot runner where the temperature is highest. This embedded material may oxidize over several cycles before flaking off and being carried in to the lens molding cavity where it appears as a brown swirl defect.

Once an acceptable mold design is achieved from the simulation (step 60), a hot runner can be machined with the alternate layout, per step 62. After installation and testing, resin is injected in step 64, and the lenses are tested in step 66. If the lenses are within specifications, then lens manufacturing can proceed, per step 68.

Examples of Different Thermoplastic Materials

The co-injection template includes a materials library with about 700 polymer references. Each reference can be considered a database record with entries defining various material properties for that polymer. Users can create records to add materials to the database. To do this, the conditions for running a particular simulation are identified. The entire set of conditions including temperatures, times, shear and pressure is known as the domain. A new material is tested to generate data that covers the domain. That is, the material is subject to the various temperatures, times, shears and pressures in a lab. The resulting behavior of the material is recorded and constitutes the data that will be entered into a new record defining the material to be added. Below are several exemplary record listings, illustrating the form and type of data required to add a new material record.

Material 1—Lexan Polycarbonate
Property 1—Rheological properties (viscosity as a function of temperature, shear rate and pressure).
Property 2—Thermal properties (density, specific heat, thermal conductivity).
Property 3—PVT properties.
Material 2—Nylon
Property 1—Rheological properties (viscosity as a function of temperature, shear rate and pressure).
Property 2—Thermal properties (density, specific heat, thermal conductivity).

Property 3—PVT properties.

Material 3—Thermoplastic Polyurethane (TPU)

Property 1—Rheological properties (viscosity as a function of temperature, shear rate and pressure).

Property 2—Thermal properties (density, specific heat, thermal conductivity).

Property 3—PVT properties.

For thermoplastics, behavior is generally described using mathematical models such as Carreau-WLF, Cross-WLF for rheological properties, or 2-domain Tait for PVT properties. Other suitable models are known within the art.

Once the new record contains all the data that covers the domain, simulations can be run with the new material. For highly pseudoplastic materials the flow characteristics are different than those for a highly Newtonian fluid. In case of pseudoplastic, there is, in general, a reduced tendency to form regions of no-flow, creating potential dead spots. While Newtonian fluids have a greater tendency to form regions of no-flow. These behaviors can be tested and accounted for in the material database.

Cast Lenses

Figure 5:
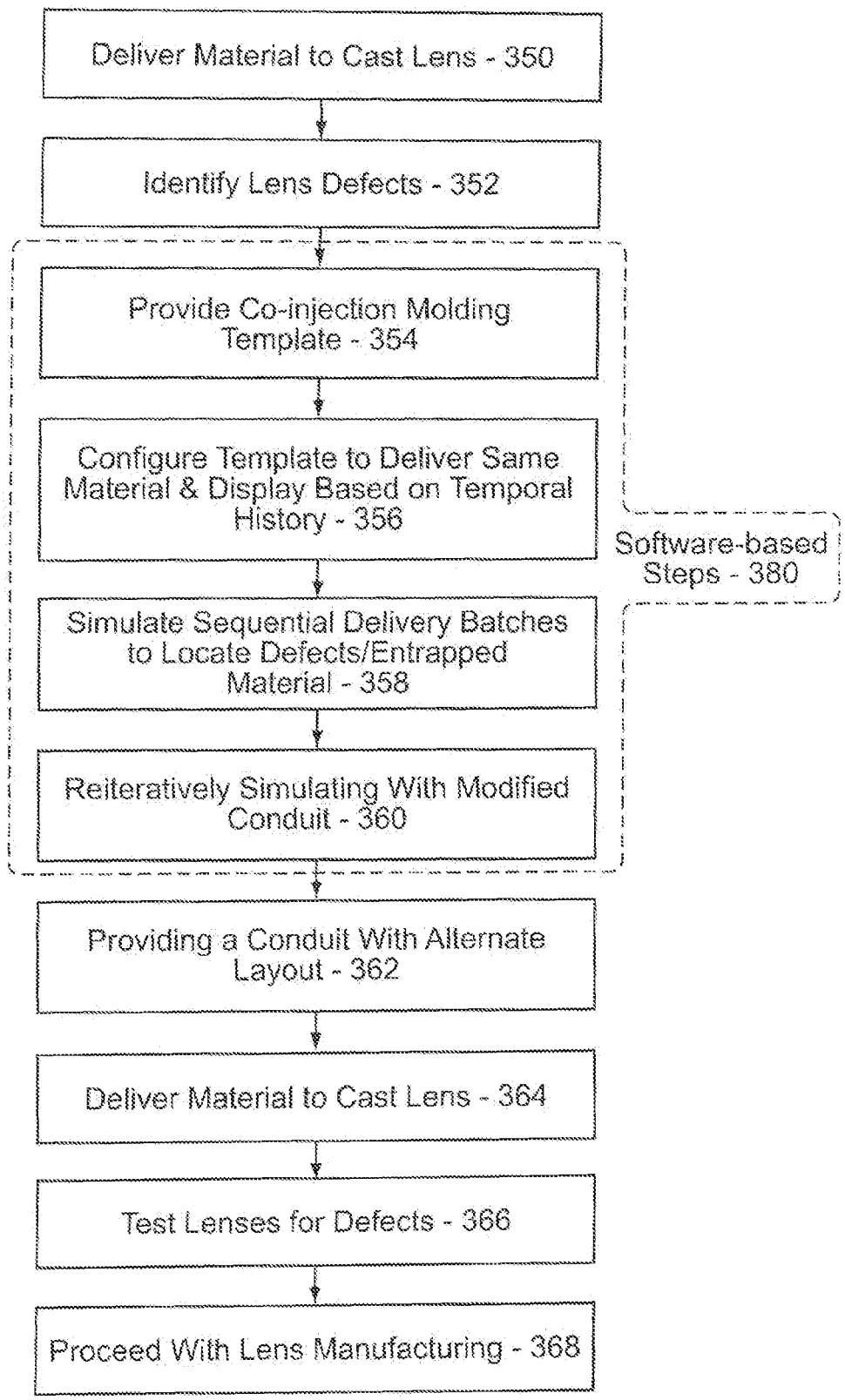
FIG. 5 is a flowchart illustrating further embodiment of a method according to the invention to correct defects in a monomer delivery system for cast lenses.

In a cast lens system, the invention operates according to the flow chart of FIG. 5. In the typical casting process, monomer and initiator is delivered to the mold in step 350. Lens defects are identified in step 352. To correct these defects according to the invention we provide a co-injection molding template, and store a finite element (FE) mesh of delivery conduit in electronic memory in step 354. Next we configure the template to deliver same monomer and display monomer differently based on temporal history 356.

The process proceeds to simulate sequential delivery batches to locate defects in conduit; i.e. sections where monomer may become entrapped and prematurely polymerize before entering the cast mold; bits of entrapped monomer subsequently flake off and enter the mold where they appear as defects 358. Next, the simulation is reiteratively run with modified conduit designs 360 until the entrapped or premature polymerization is reduced or eliminated. The simulation comprises creating a finite element (FE) mesh of an alternate material conduit configuration and storing same in memory 454a.

The steps 354-360 comprise software based steps 380. By this process many different conduit configurations can be tested before actual conduits are made and installed on the manufacturing floor. Once a suitable electronic conduit configuration is selected, we provide an actual conduit with an alternate configuration in step 362. The conduit is installed and monomer and initiator are delivered through the conduit to cast a lens 364. The lenses are tested for defects 366. If the lenses pass inspection, cast lens manufacturing may proceed 368.

Figure 6:
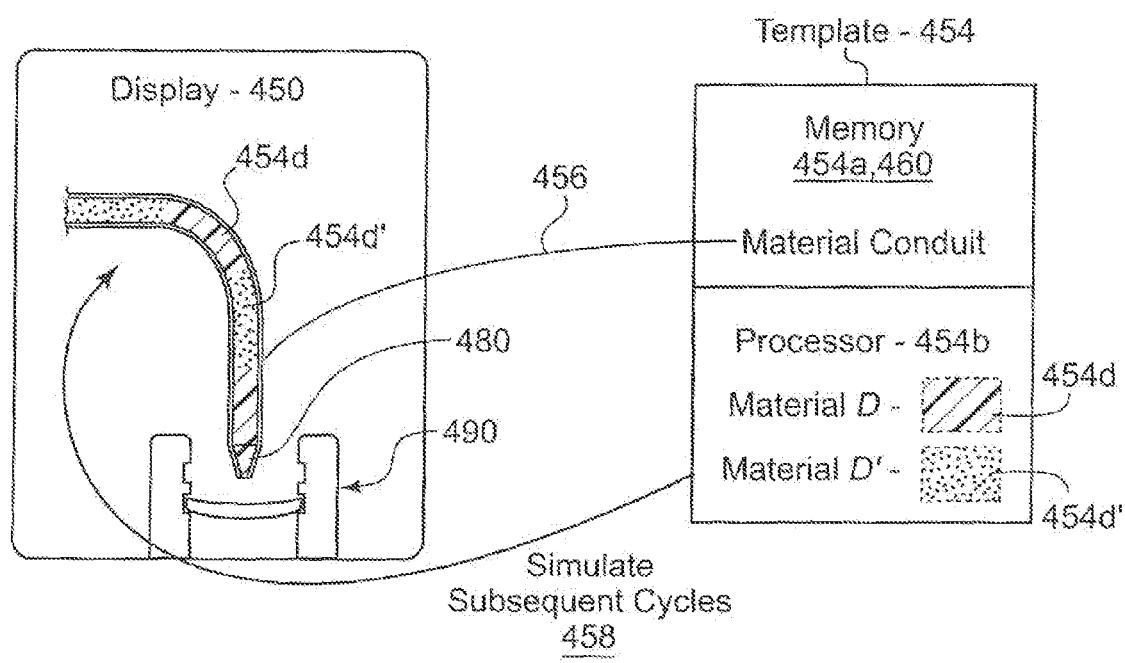
FIG. 6 is a schematic diagram illustrating a further embodiment of the simulation system according to the invention configured for subsequent cycles.

FIG. 6 illustrates how the simulation template 454 is modified to display 450 a material delivery conduit 456 which is stored as a finite element (FE) mesh in memory 454a. The display 450 and memory 454a are coupled to a general purpose computer processor 454b that is running the co-injection template software. The D (454d) and D' (454d') resin are chosen to be the same material. The co-injection template software is designed to simulate two batches of different material in each being conveyed in their own conduit as shown in FIG. 3. Surprisingly, the invention comprises an unforeseen alternate configuration of the software designed to simulate two batches of the same material in one conduit. This is referred to as step 358 labelled Simulate Sequential Delivery Batches to Locate Defects/Entrapped Material. It is illustrated on FIG. 6 as Simulate Subsequent Cycles 458 which would comprise an animated video where material is conveyed through the conduit 456.

Conduit 456 contains material 454d at the nozzle end thereof. The amount of material 454d comprises about one shot. Behind this shot, there resides one shot of material 454d'. Continuing up the delivery conduit, are alternating shots of material 454d and 454d'. A shot is defined as the volume of material used in one cycle to fill the mold 490. In casting a lens, most of the material 454d at the nozzle 480 should be delivered to the casting mold 490. This would bring one shot of material 454d' to the nozzle. In casting the second lens, most of the 454d' material should be delivered to the next empty mold.

The material comprises a monomer and initiator that fills the mold 490, which is shown with a lower mold part. A second upper mold part will be installed to create a mold cavity in the shape of a lens. The completed mold will be conveyed to a further processing station, where the casting material will be polymerized via heat or UV radiation. However, after the monomer and initiator are combined, some small degree of polymerization begins to occur. Accordingly, the material must be transported through the conduit and delivered to the mold in a timely manner. If the material is delayed, a significant degree of polymerization can occur which can lead to defects in the lens.

Once defects are identified, the simulation is configured to reflect the actual conditions on the manufacturing floor where the defects are occurring. It has been discovered that the configuring of the template according to the invention, can lead to the discovery of entrapped monomer in the delivery conduit. Typically, the monomer is combined with the initiator and the resulting material 454d and 454d' passes through the conduit in N cycles. A cycle is the time from the filling of one mold 490 to the filling of the next mold. The shape or configuration of the conduit may cause dead spots where material remains in the conduit for some number of cycles greater than N. This can be represented as N+1, N+2, . . . , N+X. Furthermore, material which remains for longer than N+T will result in a lens defect.

The template is configured to account for rheological properties including viscosity as a function of temperature, shear rate and time or degree of conversion. The properties may further include reaction kinetic properties, where reaction rate is a function of conversion, time and temperature. The properties may also include shrinkage properties and thermal properties, for example, density, Specific Heat and thermal conductivity. As the material is forced through the conduit, a combination of one or more of the above properties may increase viscosity. As the material becomes more resistant to flow, it may remain entrapped in curves or joints. The residence time can then be calculated to determine if it exceeds N+T.

An alternate conduit can be designed and stored as a further finite element (FE) mesh in memory 460. Simulations can be run to see if all the material exits the conduit in a period of time less than N+T, per step 360. Once a suitable conduit is selected a hardware conduit can be constructed according to step 362. Actual material is conveyed to cast lenses in step 364. The lenses are tested for defects 366 and lens manufacturing can proceed 368.

Examples of Different Thermoset Materials

The co-injection template includes a materials library with various material references. Each reference can be considered a database record with entries defining various material properties for that polymer. Users can create records to add materials to the database. To do this, the conditions for running a particular simulation are identified. In the case of monomer, the entire set of conditions including rheological properties, reaction kinetic properties, thermal and shrinkage is known as the domain. A new material is tested to generate data that covers the domain. That is, the material is subject to the various temperatures, times, shears and pressures in a lab. The resulting behavior of the material is recorded and constitutes the data that will be entered into a new record defining the material to be added. Below are several exemplary record listings, illustrating the form and type of data required to add a new material record.

Sample Material Records to be Used with Casting Material
Cast Material 1—CR39
Property 1—Rheological properties (viscosity as a function of temperature, shear rate and time or degree of conversion).
Property 2—Reaction kinetics properties (reaction rate as a function of conversion, time and temperature).
Property 3—Thermal properties (density, Specific Heat and thermal conductivity).
Property 4—Shrinkage properties.
Cast Material 2—High Index Materials
Property 1—Rheological properties (viscosity as a function of temperature, shear rate and time or degree of conversion).
Property 2—Reaction kinetics properties (reaction rate as a function of conversion, time and temperature).
Property 3—Thermal properties (density, Specific Heat and thermal conductivity).
Property 4—Shrinkage properties.

For thermosets, behavior is generally described using mathematical models such as Nth order reaction, autocatalytic reaction models for kinetic properties, Castro and Macosko and Hershel-Bulkley-WLF for rheological properties. Other suitable models are known within the art. High Index Materials are classified as having a Refractive Index between 1.640 and 1.740. They include polyurethanes and thiourethanes. An example of High Index Materials includes the tradenames MR-7 having a Refractive Index of 1.67; MR-10 having an Index of 1.67; and MR-174 having an Index of 1.74. The MR materials are available from Mitsui Chemicals.

System Details

A further embodiment of the invention comprises a storage device, for example a hard drive, flash memory or other suitable volatile or non-volatile digital memory. A general purpose digital computer is operatively coupled to said storage device. The computer includes a set of instructions, for example a software application to run a co-injection simulation. A display device, for example a CRT or LED display is operatively coupled to the computer. The co-injection software template is designed to display one material in a visually distinctive manner from a second material. For example, one material is displayed in red and the second in green.

A finite element FE mesh of a delivery conduit is stored in the storage device. Specific components such as a hot runner, cold runner and mold cavity may also be stored. The template is configured so that a further set of instructions is provided which simulates the same material being sequentially shot through the hot runner or other conduit. The simulation tracks the temporal or thermo-mechanical history of the resin, or batches of resin. The display is used to show one resin with a first temporal history in a visually distinctive manner from a second resin having a second temporal history. The same can be displayed with regard to thermo-mechanical history.

There has been provided a method and system for monitoring lens material within a conduit for reducing lens defects. By tracking material from batch to batch, an assessment can be made as to whether old material is remaining embedded in the conduit for longer than expected. Thermoplastic can degrade and casting material can prematurely polymerize if it remains for extended times in the conduit. Both conditions can result in lens defects. The methods and systems described herein allow engineers to correct conduit designs and configurations to reduce such defects.

While certain details have been shown and described with respect to hardware, system, and process steps, it should be understood that other options and variations may be incorporated within the spirit of the invention. Various storage devices, computer systems, and software applications may be used. The elements shown in the figures may be implemented in various forms of hardware, software, or combinations thereof. Preferably, these elements are implemented in software on one or more appropriately programmed general-purpose digital computers having a processor and memory and input/output interfaces.

Implementations of the present principles can take the form of an entirely hardware embodiment, an entirely software embodiment, or an embodiment including both hardware and software elements. Certain aspects of the present invention involving data processing, and material simulation steps are implemented in software, which includes but is not limited to firmware, resident software, microcode, etc.

The present principles may be implemented and can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, or semiconductor system (or apparatus or device). Examples of computer-readable media include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD.

A data processing system suitable for storing and/or executing program code may include at least one processor coupled directly or indirectly to a server and memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers. Network adapters may also be coupled to the system to enable the data processing system to become coupled to other data processing systems or remote printers, servers, or storage devices through intervening private or public networks. Modems, cable modems, and Ethernet cards are just a few of the currently available types of network adapters.

Having described preferred embodiments for processes, apparatus, and systems used therein for providing improved material delivery to reduce lens defects (which are intended to be illustrative and not limiting), it is noted that modifications and variations can be made by persons skilled in the art in light of the above teachings. The invention may be embodied in other specific forms without departing from its spirit or essential characteristics. The described examples are to be considered in all respects only as illustrative and not restrictive. The scope of the invention is, therefore, indicated by the appended claims rather than by the foregoing description. All changes which come within the meaning and range of equivalency of the claims are to be embraced within their scope. Having thus described the invention with the details and particularity required by the patent laws, what is claimed and desired protected by Letters Patent is set forth in the appended claims.

What is claimed is:

1. A method of monitoring lens material resident within a conduit to improve the quality of molded lenses by reducing defects arising from entrapped lens material, comprising the steps of:
    storing a finite element mesh representative of a conduit in a digital storage device;
    running a simulation with a co-injection software template that simultaneously injects partial shots of two different resins having a positive flow rate during a single molding cycle on a digital computer by configuring the template to simulate (i) one type of lens material sequentially flowing through the conduit in discrete batches (ii) a first batch having a zero flow rate sitting in the conduit until the second batch flows therethrough and (iii) a portion of the first batch remaining entrapped within the conduit; and
    tracking the temporal history of the batches within the conduit and displaying the different batches on a visual display so that product degradation resulting from extended residence time of entrapped resin can be identified, wherein the display device and the storage device are operatively coupled to the digital computer.

2. The method of claim 1, wherein during said tracking step each batch is displayed in a visually distinguishable manner.

3. A method of monitoring lens material residence time within a conduit to improve the quality of molded lenses by reducing defects arising from entrapped lens material, comprising the steps of:
    storing a finite element mesh representative of a conduit in a digital storage device;
    running a simulation on a digital computer in which one type of lens material sequentially flows through the conduit in discrete batches, wherein said running step includes providing a co-injection software template that simulates simultaneously injecting a partial shot of A resin having a first, non-zero, positive flow rate and a partial shot of B resin having a second, non-zero, positive flow rate into a mold cavity during a single molding cycle to form a molded product made collectively from the A and B resins, where the A resin has different physical properties than the B resin and each resin type has a singular display mode; and configuring the template to simulate (i) a C material that is the same as a C' material, (ii) the C material batch having a zero flow rate and sitting in the conduit until the C' material batch flows therethrough, and (iii) C material which remains entrapped within the conduit; and
    tracking the temporal history of the batches within the conduit including displaying different batches on a visual display device where each batch is displayed in a visually distinguishable manner so that product degradation resulting from extended residence time in the conduit can be identified, wherein the display device and the storage device are operatively coupled to the digital computer.

4. The method of claim 3, further including the step of running the simulation with new materials by defining the domain of lens manufacturing and generating data from the new material which covers the domain and entering the generated data into the software template.

5. The method of claim 3, further including:
    storing a finite element mesh representative of a cavity in an injection molding machine in the digital storage device, wherein the conduit comprises a hot runner manifold;
    running a simulation on a digital computer in which one type of lens material sequentially flows through the hot runner in discrete batches representative of cycles in an injection molding process; and
    tracking the thermo-mechanical history of the batches within the hot runner.

6. The method of claim 5, wherein the material is selected from the group of thermoplastics consisting of polycarbonate, nylon and thermoplastic polyurethane;
    wherein the simulation accounts for thermal properties of the material and the injection molding machine; and
    wherein the simulation accounts for the flow characteristics of the material as they flow through the hot runner ranging from highly pseudoplastic material flow to highly Newtonian flow, whereby the more pseudoplastic the material flow the less likely it is for the material to form no-flow regions within the hot runner.

7. The method of claim 6, further including:
    storing a finite element mesh representative of a cold runner and an edge gate in an injection molding machine in the digital storage device, wherein the hot runner manifold connects to the cold runner, and wherein the cold runner connects to each mold cavity via only one edge gate, wherein the mold cavity is a lens forming cavity.

8. The method of claim 6, further including:
    wherein simulating the flow characteristics identities where material is entrapped in the hot runner and entrapped material has an extended thermo-mechanical history; the entrapped material subsequently flakes off and enters the mold cavity causing defects, wherein the mold cavity is a lens forming cavity.

9. The method of claim 3, further including:
    running a simulation on a digital computer in which one type of castable lens material sequentially flows through the conduit in discrete batches into a mold cavity comprising a casting mold; and
    tracking the temporal history of the batches within the conduit to identify entrapped material, wherein the entrapped material prematurely polymerizes and subsequently flakes off and enters the casting mold forming defects.

10. The method of claim 9, wherein the castable lens material is selected from the group of thermoset materials consisting of allyl diglycol carbonate, high index materials having a refractive index above about 1.640, thiourethane and polyurethane.

11. A system for monitoring lens material resident within a conduit to improve the quality of molded lenses by reducing defects arising from entrapped lens material, comprising:
    a digital storage device storing a finite element mesh representative of a conduit;
    a digital computer coupled to said digital storage device for executing a set of instructions to run a simulation with a co-injection software template that simultaneously injects partial shots of two different resins having a positive flow rate during a single molding cycle by configuring the template to simulate (i) one type of lens material sequentially flowing through the conduit in discrete batches (ii) a first hatch having a zero flow rate sitting in the conduit until the second batch flows therethrough and (iii) a portion of the first batch remaining entrapped within the conduit and tracking the temporal history of the batches within the conduit; and a display device operatively coupled to said digital computer for displaying different batches so that product degradation resulting from extended residence time of entrapped resin can be identified.

12. The system of claim 11, wherein the display device displays each batch in a visually distinguishable manner.

13. A system for monitoring lens material resident within a conduit to improve the quality of molded lenses by reducing defects arising from entrapped lens material, comprising:

a digital storage device storing a finite element mesh representative of a conduit;

a digital computer coupled to said digital storage device for executing a set of instructions to run a simulation in which one type of lens material sequentially flows through the conduit in discrete batches and tracking the temporal history of the batches within the conduit, wherein said set of instructions comprise a co-injection software template that simulates simultaneously injecting a partial shot of A resin having a first, non-zero, positive flow rate and a partial shot of B resin having a second, non-zero, positive flow rate into a mold cavity during a single molding cycle to form a molded product made collectively from the A and B resins, where the A resin has different physical properties than the B resin and each resin type has a singular display mode; and wherein the template is configured to simulate (i) a C material that is the same as a C' material, (ii) the C material batch having a zero flow rate and sitting in the conduit until the C' material batch flows therethrough, and (iii) C material which remains entrapped within the conduit; and a display device operatively coupled to said digital computer for displaying different batches where each batch is displayed in a visually distinguishable manner so that product degradation resulting from extended residence time in the conduit can be identified.

14. The system of claim 13, further comprising a new material data record stored in said memory, wherein said new material data record comprises data which covers the domain of lens manufacturing and providing a set of instructions to run the simulation with the new materials.

15. The system of claim 13, further including:

a finite element mesh representative of a cavity in an injection molding machine stored in the digital storage device, wherein the conduit comprises a hot runner manifold;

said digital computer executing a set of instructions to simulate one type of lens material sequentially flowing through the hot runner in discrete batches representative of cycles in an injection molding process and tracking the thermo-mechanical history of the batches within the hot runner.

16. The system of claim 15, wherein the material is selected from the group of thermoplastics consisting of polycarbonate, nylon and thermoplastic polyurethane;

wherein the simulation accounts for thermal properties of the material and the injection molding machine; and wherein the simulation accounts for the flow characteristics of the material as they flow through the hot runner ranging from highly pseudoplastic material flow to highly Newtonian flow, whereby the more pseudoplastic the material flow the less likely it is for the material to form no-flow regions within the hot runner.

17. The system of claim 16, wherein said memory includes a finite element mesh representative of a cold runner and an edge gate in an injection molding machine in the digital storage device, wherein the hot runner manifold connects to the cold runner, and wherein the cold runner connects to each mold cavity via only one edge gate, wherein the mold cavity is a lens forming cavity.

18. The system of claim 16, wherein executing the set of instructions simulates the flow characteristics and identifies where material is entrapped in the hot runner.

19. The system of claim 13, wherein the digital computer contains a set of instructions to simulate one type of castable lens material sequentially flowing through the conduit in discrete batches into a mold cavity comprising a casting mold and tracking the temporal history of the batches within the conduit to identify entrapped material, wherein the entrapped material prematurely polymerizes and subsequently flakes off and enters the casting mold forming defects.

20. The system of claim 19, wherein the castable lens material is selected from the group of thermoset materials consisting of allyl diglycol carbonate, high index materials having a refractive index above about 1.640, thiourethane and polyurethane.

* * * * *

UNITED STATES PATENT AND TRADEMARK OFFICE
CERTIFICATE OF CORRECTION

| | |
|---|---|
| PATENT NO. | : 8,589,134 B2 |
| APPLICATION NO. | : 13/025246 |
| DATED | : November 19, 2013 |
| INVENTOR(S) | : Severine Tisne and Paresh Kitchloo |

It is certified that error appears in the above-identified patent and that said Letters Patent is hereby corrected as shown below:

In the Claims

Column 15, line 6 (claim 11, line 13), delete "hatch" and insert --batch--.

Signed and Sealed this
Eighteenth Day of February, 2014

Michelle K. Lee
*Deputy Director of the United States Patent and Trademark Office*